(12) United States Patent
Sofia et al.

(10) Patent No.: US 10,601,441 B2
(45) Date of Patent: Mar. 24, 2020

(54) EFFICIENT SOFTWARE CLOSING OF HARDWARE-GENERATED ENCODING CONTEXT

(71) Applicant: INTERNATIONAL BUSINESS MACHINES CORPORATION, Armonk, NY (US)

(72) Inventors: Anthony T. Sofia, Hopewell-Junction, NY (US); Jonathan D. Bradbury, Poughkeepsie, NY (US); Matthias Klein, Wappingers Falls, NY (US); Bruce Giamei, Lagrangeville, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/358,764

(22) Filed: Mar. 20, 2019

(65) Prior Publication Data

US 2019/0312588 A1 Oct. 10, 2019

Related U.S. Application Data

(63) Continuation of application No. 15/948,763, filed on Apr. 9, 2018, now Pat. No. 10,333,548.

(51) Int. Cl.
*H03M 7/30* (2006.01)
*H03M 7/40* (2006.01)

(52) U.S. Cl.
CPC .......... *H03M 7/3086* (2013.01); *H03M 7/40* (2013.01); *H03M 7/4037* (2013.01); *H03M 7/6011* (2013.01)

(58) Field of Classification Search
None
See application file for complete search history.

(56) References Cited

U.S. PATENT DOCUMENTS 7,298,297 B1 11/2007 Li
9,503,122 B1 11/2016 Henry et al.
(Continued)

OTHER PUBLICATIONS

List of IBM Patents or Patent Applictions Treated as Related; (Appendix P),2 pages.
(Continued)

*Primary Examiner* — Howard Williams
(74) *Attorney, Agent, or Firm* — Cantor Colburn LLP; William Kinnaman

(57) ABSTRACT

Systems, methods, and computer-readable media are described for performing data compression in a manner that does not require software to make a call to hardware to close a compressed data block, thereby reducing computational overhead. In response to a request from software to data compression hardware for a data encoding, the hardware may return the data encoding as well as an end-of-block symbol encoding value and bit length. The hardware may load the end-of-block symbol encoding value and bit length into a different area in the returned structure such that the software has direct access to the value. When the software determines that a block should be closed, the software may retrieve the end-of-block symbol and insert it into the block without needing to make a call to hardware. The software may then make a call to the hardware to request a new data encoding for subsequent compressed data blocks.

20 Claims, 4 Drawing Sheets

(56) References Cited

U.S. PATENT DOCUMENTS

| | | |
|---|---|---|
| 9,509,336 B1 * | 11/2016 | Henry ..................... H03M 7/30 |
| 10,333,548 B1 | 6/2019 | Sofia et al. |
| 2007/0109153 A1 | 5/2007 | Ma et al. |
| 2015/0229326 A1 | 8/2015 | Harnik et al. |
| 2016/0233882 A1 | 8/2016 | Agarwal et al. |
| 2016/0336962 A1 | 11/2016 | Henry et al. |
| 2016/0380649 A1 | 12/2016 | Henry et al. |
| 2017/0099064 A1 | 4/2017 | Kataoka |
| 2018/0026656 A1 | 1/2018 | Gopal et al. |

OTHER PUBLICATIONS

Nidhi Dhawale, "Implementation of Hoffman Algorithm and Study for Optimization," Mtech VLSI Design Dept. of Electronics, 7319, 2014, 6 pgs.

* cited by examiner

EFFICIENT SOFTWARE CLOSING OF HARDWARE-GENERATED ENCODING CONTEXT

DOMESTIC PRIORITY

This application is a continuation of U.S. patent application Ser. No. 15/948,763, filed Apr. 9, 2018, the disclosure of which is incorporated by reference herein in its entirety.

BACKGROUND

The process of reducing the size of a data file is referred to as data compression. Data compression involves encoding information using fewer bits than the original representation. In the context of data transmission, the process may be referred to as source coding—encoding done at the source of the data before it is stored or transmitted. Data compression is useful because it reduces resources required to store and transmit data. Computational resources are consumed in the compression process, and typically, in the reversal of the process (decompression). The design of data compression schemes involves trade-offs among various factors including the degree of compression, the amount of distortion introduced (if lossy data compression is used), and the computational resources required to compress and decompress data.

SUMMARY

In one or more example embodiments, a method for compressing data is disclosed. The method includes sending input data to hardware configured to perform data compression and storing, by the hardware, a data encoding generated based at least in part on the input data and raw end-of-block symbol data in data storage. The method further includes sending the data and the data encoding to the hardware for compression of the data, receiving, from the hardware, compressed data generated by the hardware from the data using the data encoding, and inserting the compressed data into a current compressed data block. The method additionally includes determining that the current compressed data block is to be closed, retrieving the raw end-of-block symbol data from the data storage, inserting the raw end-of-block symbol data into the current compressed data block to close the current compressed data block, and making a call to the hardware to generate a new data encoding.

In one or more other example embodiments, a system for compressing data is disclosed. The system includes at least one memory storing computer-executable instructions and at least one processor of a sending device, the at least one processor being configured to access the at least one memory and execute the computer-executable instructions to perform a set of operations. The operations include sending input data to hardware configured to perform data compression and storing, by the hardware, a data encoding generated based at least in part on the input data and raw end-of-block symbol data in data storage. The operations further include sending the data and the data encoding to the hardware for compression of the data, receiving, from the hardware, compressed data generated by the hardware from the data using the data encoding, and inserting the compressed data into a current compressed data block. The operations additionally include determining that the current compressed data block is to be closed, retrieving the raw end-of-block symbol data from the data storage, inserting the raw end-of-block symbol data into the current compressed data block to close the current compressed data block, and making a call to the hardware to generate a new data encoding.

In one or more other example embodiments, a computer program product for compressing data is disclosed. The computer program product includes a non-transitory storage medium readable by a processing circuit, the storage medium storing instructions executable by the processing circuit to cause a method to be performed. The method includes sending input data to hardware configured to perform data compression and storing, by the hardware, a data encoding generated based at least in part on the input data and raw end-of-block symbol data in data storage. The method further includes sending the data and the data encoding to the hardware for compression of the data, receiving, from the hardware, compressed data generated by the hardware from the data using the data encoding, and inserting the compressed data into a current compressed data block. The method additionally includes determining that the current compressed data block is to be closed, retrieving the raw end-of-block symbol data from the data storage, inserting the raw end-of-block symbol data into the current compressed data block to close the current compressed data block, and making a call to the hardware to generate a new data encoding.

BRIEF DESCRIPTION OF THE DRAWINGS

The detailed description is set forth with reference to the accompanying drawings. The drawings are provided for purposes of illustration only and merely depict example embodiments of the disclosure. The drawings are provided to facilitate understanding of the disclosure and shall not be deemed to limit the breadth, scope, or applicability of the disclosure. In the drawings, the left-most digit(s) of a reference numeral identifies the drawing in which the reference numeral first appears. The use of the same reference numerals indicates similar, but not necessarily the same or identical components. However, different reference numerals may be used to identify similar components as well. Various embodiments may utilize elements or components other than those illustrated in the drawings, and some elements and/or components may not be present in various embodiments. The use of singular terminology to describe a component or element may, depending on the context, encompass a plural number of such components or elements and vice versa.

DETAILED DESCRIPTION

Figure 1:
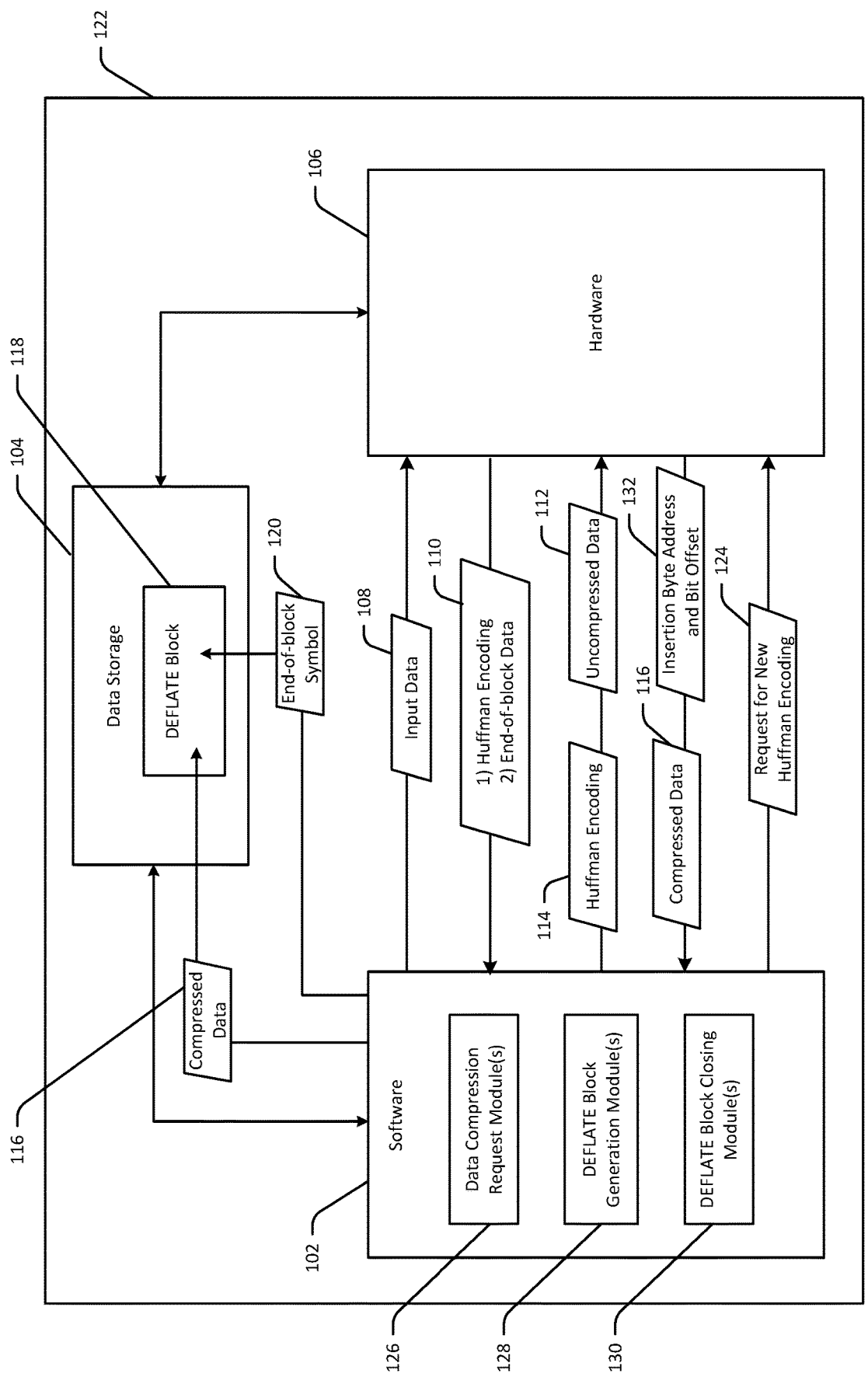
FIG. 1 is a schematic hybrid data flow/block diagram illustrating software closing of a hardware-generated encoding context in accordance with example embodiments.

Example embodiments include, among other things, systems, methods, computer-readable media, techniques, and methodologies for performing data compression in a manner that does not require software to make a call to hardware to close a compressed data block, thereby reducing computational overhead. In particular, in accordance with example embodiments, in response to a request from software to data compression hardware for a data encoding, the hardware may return the data encoding as well as an end-of-block symbol encoding value and bit length. The hardware may load the end-of-block symbol encoding value and bit length into a different area in the returned structure such that the software has direct access to the value. When the software determines that a compressed data block should be closed, the software may retrieve the end-of-block encoded value and bit length and insert it into the compressed data block without needing to make a call to hardware or manually parse the provided encoding for all symbols. The software may then make a call to the hardware to request a new data encoding to be used in connection with subsequent compressed data blocks.

Example embodiments will be described herein in connection with the DEFLATE compression standard. However, it should be appreciated that embodiments of the invention may be applicable to other compression standards as well. The DEFLATE compression standard is a lossless data compression algorithm and associated file format that uses a combination of the LZ77 algorithm and Huffman encoding. Huffman encoding, also referred to as Huffman coding, refers to the algorithmic process for finding and/or using a Huffman code, which is a particular type of optimal prefix code that may be used for lossless data compression. The output from Huffman's algorithm can be viewed as a variable-length code table or tree for encoding a source table (e.g., a character in a file). Huffman's algorithm derives the Huffman table or tree from the estimated probability or frequency of occurrence (weight) for each possible value of the source symbol, where more common symbols are generally represented using fewer bits than less common symbols.

A compressed DEFLATE stream contains multiple compressed data blocks, which may be referred to as DEFLATE blocks. In order to maximize compression ratios if data changes over the life of a file, each DEFLATE block contains a Huffman encoding that is specific to the data represented by that block. Software may need to close a current DEFLATE block and begin a new one for various reasons. In particular, when hardware is used to compress data, the software-level interface may need to manipulate the data in the compressed data stream. For instance, a request to compress 4 KB of data may be sent to hardware that will perform the compression. Then, software might be called to do a specific kind of flush to close a block and re-open a new block to insert some control data that a decompressor can use to locate a specific spot in the file. Various approaches are known for closing a DEFLATE block and creating a new one. However, these approaches suffer from various drawbacks. Embodiments of the invention provide technical solutions that address at least some of these drawbacks.

For a single large input file to be compressed, the compression may occur in 32 KB at a time requests, for example. An existing approach for creating a new block may be to create a custom Huffman table for each 32 KB request, in which case, the output from compressing the 32 KB is one block in the overall DEFLATE stream. Under this approach, every call to hardware would be synonymous with a single DEFLATE block. While this is a relatively simple implementation, the compression ratio can be negatively impacted because each Huffman table that is created for each 32 KB request may require over 100 bytes to be injected into the compressed data stream. This effect on the compression ratio may be even further exacerbated if the 32 KB requests become even smaller such as 4 KB or less in size.

If hardware accelerated compression hardware is used, the hardware accelerator may generate a Huffman encoding which the software can re-use across several requests to the accelerator. While this may obviate the compression ratio issues associated with creating and closing a DEFLATE block for each request for compression of data in small increments (e.g., 32 KB), it introduces additional computational overhead for closing a block. In particular, in order to close a DEFLATE block and start a new block, an end-of-block symbol needs to be injected into the compressed data stream. For instance, when software needs to perform a flushing operation such as that described earlier, the software needs to know the encoding of the end-of-block symbol (it has an encoding itself in the Huffman table). In certain conventional approaches, the software may make a call to the compression hardware to have the end-of-block symbol injected into the compressed data stream. However, this would create additional overhead for the accelerator. In other approaches, a combined operation to insert an end-of-block symbol and begin a new block may be implemented in hardware. However, this would make the compression hardware more complex and costly to implement. Yet another conventional approach would be to have the software indicate to the hardware that a current DEFLATE block is to be closed while also providing the hardware with new input to be compressed. However, because all input may not be consumed, this approach would also introduce additional complexity in the hardware design. In particular, the hardware must determine whether it should still close the block if all data has not been consumed by the current request for compression. Under this approach, the hardware request would need to be re-run to process the additional input data before the hardware can insert the end-of-block symbol, which would introduce additional complexity in the hardware design.

Example embodiments of the invention provide a mechanism by which software can close a compressed data block and begin a new block without making a separate call to hardware, thereby avoiding the computational overhead and hardware design complexity associated with making such a call, while at the same time allowing for re-use of a data encoding across multiple compression requests. In accordance with example embodiments, compression hardware may generate a Huffman encoding (e.g., a Huffman table/ Huffman tree) based on some input data. The hardware may dynamically generate the Huffman table or may utilize a static one defined by the DEFLATE standard. In accordance with example embodiments, along with the Huffman table, the hardware may provide the software with an end-of-block symbol encoding value and bit length. More specifically, the hardware may store the end-of-block symbol encoding value and bit length in a block of storage that is directly accessible by the software. For any given encoding, the end-of-block symbol (which may be denoted as 0x100) is encoded to a specific value based on the encoding that is used for compression. This encoded end-of-block symbol and length may be returned by the hardware.

Software may then pass the Huffman table back to the hardware along with some data to be compressed. The software may pass the Huffman table to the hardware in connection with each such data compression request. Thus, the software may re-use the same Huffman table across multiple data compression requests such that compressed data continues to be added to the same DEFLATE block. When software determines that the current DEFLATE block is to be closed and a new DEFLATE block opened, it may access the end-of-block encoding value and bit length directly from data storage and insert the end-of-block symbol into the DEFLATE block to close the block without having to make an additional call to the hardware.

Example embodiments provide various technical features, technical effects, and/or improvements to computer technology. In particular, example embodiments provide the technical effects of allowing software to re-use a data encoding (e.g., a Huffman table/tree) across multiple data compression requests to hardware, while at the same time, permitting the software to close a compressed data block (e.g., a DEFLATE block) without having to make a call to hardware. These technical effects provide an improvement to computer technology—specifically an improvement to data compression technology—by reducing the computational overhead and hardware design complexity associated with conventional approaches to closing compressed data blocks. These technical effects are achieved, at least in part, by the technical feature of having the compression hardware return, to software, an end-of-block symbol encoding value and bit length along with the data encoding itself. More specifically, along with providing the data encoding, the hardware may store the end-of-block encoding value and bit length in data storage that is directly accessible by the software such that the software can retrieve the end-of-block symbol and insert it into a compressed data block to close the block without having to make a call to the hardware.

Various illustrative methods and corresponding data structures associated therewith will now be described. It should be noted that each operation of the method 300 may be performed by one or more of the program modules or the like depicted in FIG. 1 or 4, whose operation will be described in more detail hereinafter. These program modules may be implemented in any combination of hardware, software, and/or firmware. In certain example embodiments, one or more of these program modules may be implemented, at least in part, as software and/or firmware modules that include computer-executable instructions that when executed by a processing circuit cause one or more operations to be performed. A system or device described herein as being configured to implement example embodiments may include one or more processing circuits, each of which may include one or more processing units or nodes. Computer-executable instructions may include computer-executable program code that when executed by a processing unit may cause input data contained in or referenced by the computer-executable program code to be accessed and processed to yield output data.

Figure 2:
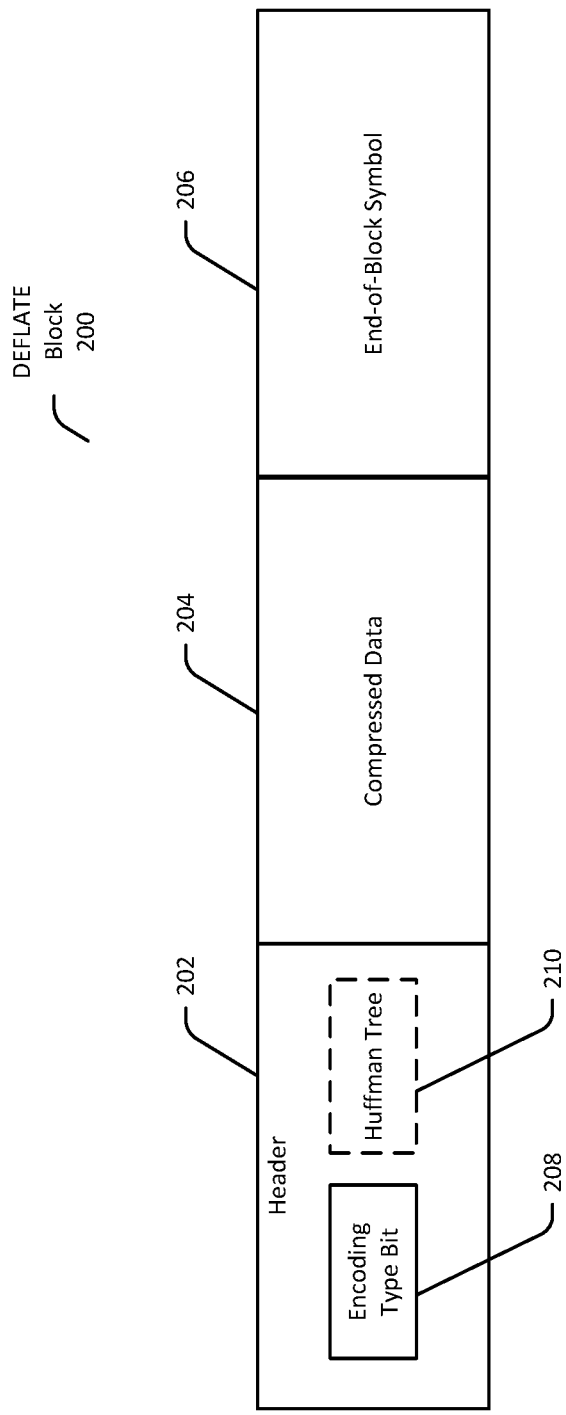
FIG. 2 is a schematic block diagram of a DEFLATE block in accordance with example embodiments.
Figure 3:
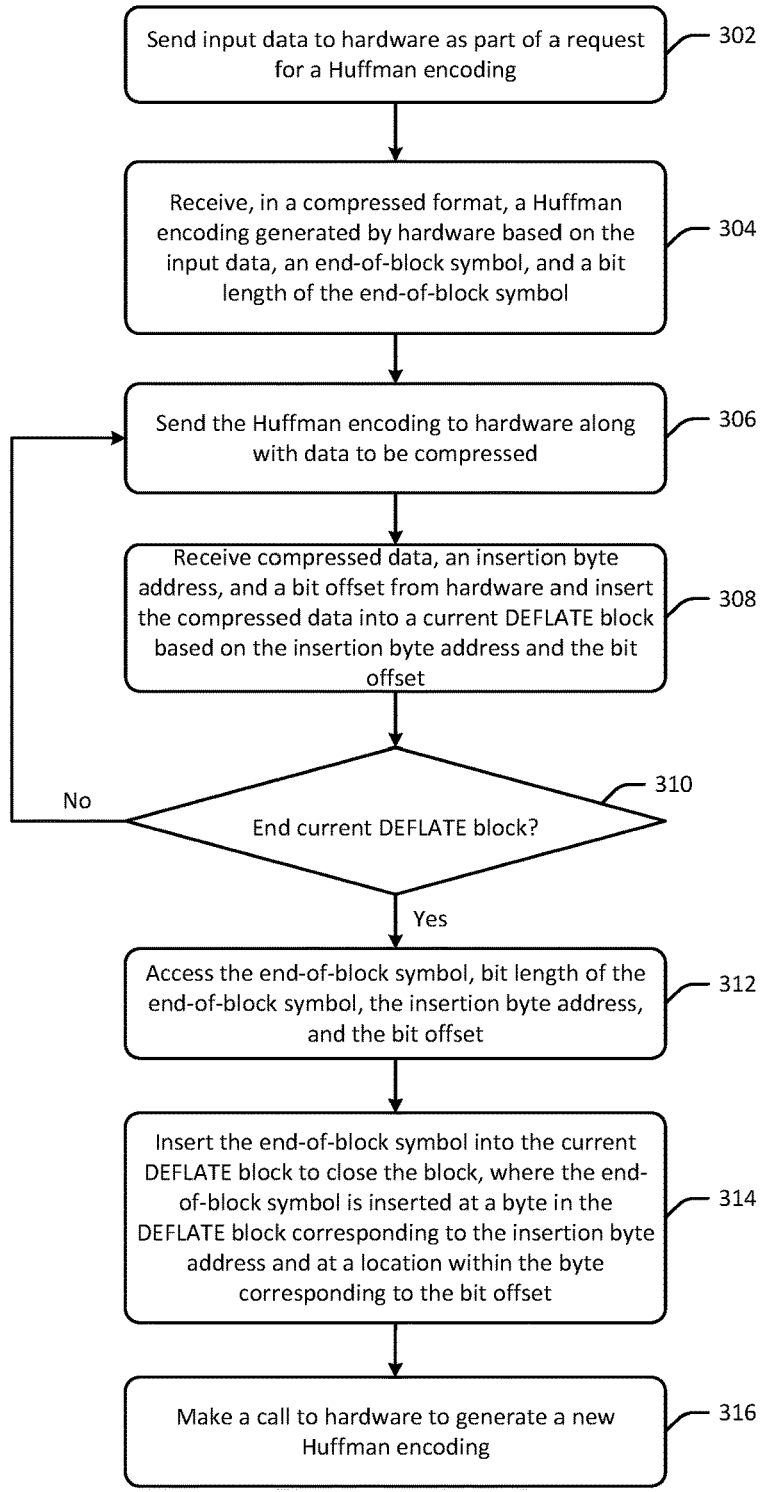
FIG. 3 is a process flow diagram of an illustrative method for software closing of a hardware-generated encoding context in accordance with one or more example embodiments.

FIG. 1 is a schematic hybrid data flow/block diagram illustrating software closing of a hardware-generated encoding context. FIG. 2 is a schematic block diagram of a DEFLATE block. FIG. 3 is a process flow diagram of an illustrative method 300 for software closing of a hardware-generated encoding context. FIGS. 2 and 3 will each be described in conjunction with FIG. 1 hereinafter.

Referring first to FIG. 1, an illustrative computing device 122 is depicted. The computing device 122 may be any suitable device capable of performing data compression. The computing device 122 may include software 102 executing on the computing device 122. The software 102 may include various program modules such as one or more data compression request modules 126, one or more DEFLATE block generation modules 128, and one or more DEFLATE block closing modules 130. The computing device 122 may further include data storage 104 and hardware 106. The hardware 106 may be configured to perform data compression in accordance with one or more data compression algorithms/standards such as the DEFLATE standard. The data storage 104 may be accessible by both the software 102 and the hardware 106. In addition, the software 102 and the hardware 106 may be configured to communicate with one another in order to perform data compression.

Referring now to FIG. 3 in conjunction with FIG. 1, at block 302 of the method 300, computer-executable instructions of the data compression request module(s) 126 may be executed to send input data 108 to the hardware 106. The input data 108 may be sent to the hardware 106 as part of a request for the hardware 106 to generate a data encoding (e.g., a Huffman table/tree) based thereon. Upon generating the Huffman table/tree, the hardware 106 may provide the encoding to the software 102 along with end-of-block data (collectively referred to as "returned data 110"), which may be received by the software 102 at block 304 of the method 300. More specifically, the hardware 106 may store the encoding for the end-of-block symbol and the bit length (collectively referred to as end-of-block data) in an area of the data storage 104 different from where the Huffman table is stored (but perhaps adjacent to) and equally accessible by the software 102. As a result, when the software 102 determines that a DEFLATE block 118 is to be closed, the software 102 can retrieve the end-of-block data from the data storage 104 directly without involving the hardware 106 in any way, as will be described in more detail hereinafter.

The software 102 retrieving the end-of-block data directly from data storage 104 eliminates the computational overhead that would otherwise be associated with making a call to the hardware 106 to close the block 118. In addition, because the output of the request sent at block 302 of the method 300 is the Huffman table stored in the format required by the DEFLATE standard (encoded and compressed), making the end-of-block data accessible independently of the Huffman table eliminates the need to deconstruct the encoded Huffman table to determine the encoding for the end-of-block symbol, which would be a computationally expensive task.

At block 306 of the method 300, computer-executable instructions of the data compression request module(s) 126 may be executed to cause the software 102 to send the Huffman tree/table 114 previously returned by the hardware 106 back to the hardware 106 along with data 112 to be compressed. The hardware 106 may then compress the data 114 using the Huffman encoding 114 and return the compressed data 116 to the software 102. In addition, the hardware 106 may also return an insertion byte address and a bit offset 132. The instruction set architecture (ISA) includes an address that points to the output buffer. After the hardware 106 has completed compression of data, this address points to the byte in the DEFLATE block 118 at which insertion of the end-of-block symbol should begin or the byte at which additional compressed data is to be included in the DEFLATE block 118, whichever the case may be. In addition, after the hardware 106 has completed compression of data, the hardware 106 must also inform the software 102 of the bit offset, which indicates the bit position in the insertion byte at which insertion of the end-of-block symbol or insertion of additional compressed data is to begin.

The software 102 may receive the compressed data 116 and the insertion byte address and bit offset 132 at block 308 of the method 300, and computer-executable instructions of the DEFLATE block generation module(s) 128 may be executed to insert the compressed data 116 into the current DEFLATE block 118 starting at a byte and a bit position within that byte indicated by the insertion byte address and the bit offset, respectively.

At block 310 of the method 300, computer-executable instructions of the DEFLATE block closing module(s) 130 may be executed to determine whether the current DEFLATE block 118 is to be closed. As previously described, the software 102 may decide to close a DEFLATE block as part of a flush operation, for example. In response to a negative determination at block 310, computer-executable instructions of the data compression request module(s) 126 and the DEFLATE block generation module(s) 128 may iteratively execute operations at block 306 and 308, respectively, to insert additional compressed data in to the DEFLATE block 118 until a positive determination is made at block 310. In this manner, the software 102 is able to re-use the same Huffman encoding 114 across multiple data compression requests.

In response to a positive determination at block 310, computer-executable instructions of the DEFLATE block closing module(s) 130 may be executed at block 312 of the method 300 to access end-of-block symbol encoding 120 and bit length as well as the insertion byte address and the bit offset from the data storage 104. As previously described, the software 102 may access the end-of-block data without having to make a call to the hardware 106 because the hardware previously returned this information along with the Huffman encoding 114.

At block 314 of the method 300, computer-executable instructions of the DEFLATE block closing module(s) 130 may be executed to insert the end-of-block symbol 120 into the current DEFLATE block 118 to close the block. The DEFLATE block closing module(s) 130 may insert the end-of-block symbol 120 at a byte in the DEFLATE block 118 corresponding to the insertion byte address 132 and at bit location within the byte corresponding to the bit offset 132.

At block 316 of the method 300, computer-executable instructions of the data compression request module(s) 126 may again be executed to make a call/send a request 124 to the hardware 106 to generate a new Huffman encoding. After generating the new Huffman encoding, the hardware 106 will return the new Huffman encoding to the software 102 along with a new end-of-block encoding value and length.

In accordance with example embodiments, the illustrative method 300 provides the software 102 with the ability to add compressed data to a block across multiple calls using the same Huffman encoding and to close the block across the multiple calls without having to make an additional call to the hardware 106. With this approach, the software 102 can close an existing block and open a new block with a different Huffman encoding independent of the hardware 106 that is compressing the data. This provides maximum flexibility to the software 102 and the least complex implementation for the hardware 106 while still providing desired compression ratios. It should be appreciated that in certain example embodiments, the software 102 may still request that the hardware 106 close a block if the software 102 knows that the data stream to be compressed has ended.

FIG. 2 is a schematic block diagram of an example DEFLATE block 200. The block 200 may be an example representation of the DEFLATE block 118. The block 200 may include a header 202, compressed data 204, and an end-of-block symbol 206 (if the block 200 has been closed). The header 202 may contain an encoding type bit 208 that is set to indicate whether the Huffman encoding used for the compressed data 204 is a static encoding defined as part of the DEFLATE standard or a dynamic Huffman encoding. If the encoding is a dynamic Huffman encoding, it may be represented by a Huffman table/tree that is stored in the header 202. If the encoding is static, it may not be stored in the block 200 itself One or more illustrative embodiments of the disclosure are described herein. Such embodiments are merely illustrative of the scope of this disclosure and are not intended to be limiting in any way. Accordingly, variations, modifications, and equivalents of embodiments disclosed herein are also within the scope of this disclosure.

Figure 4:
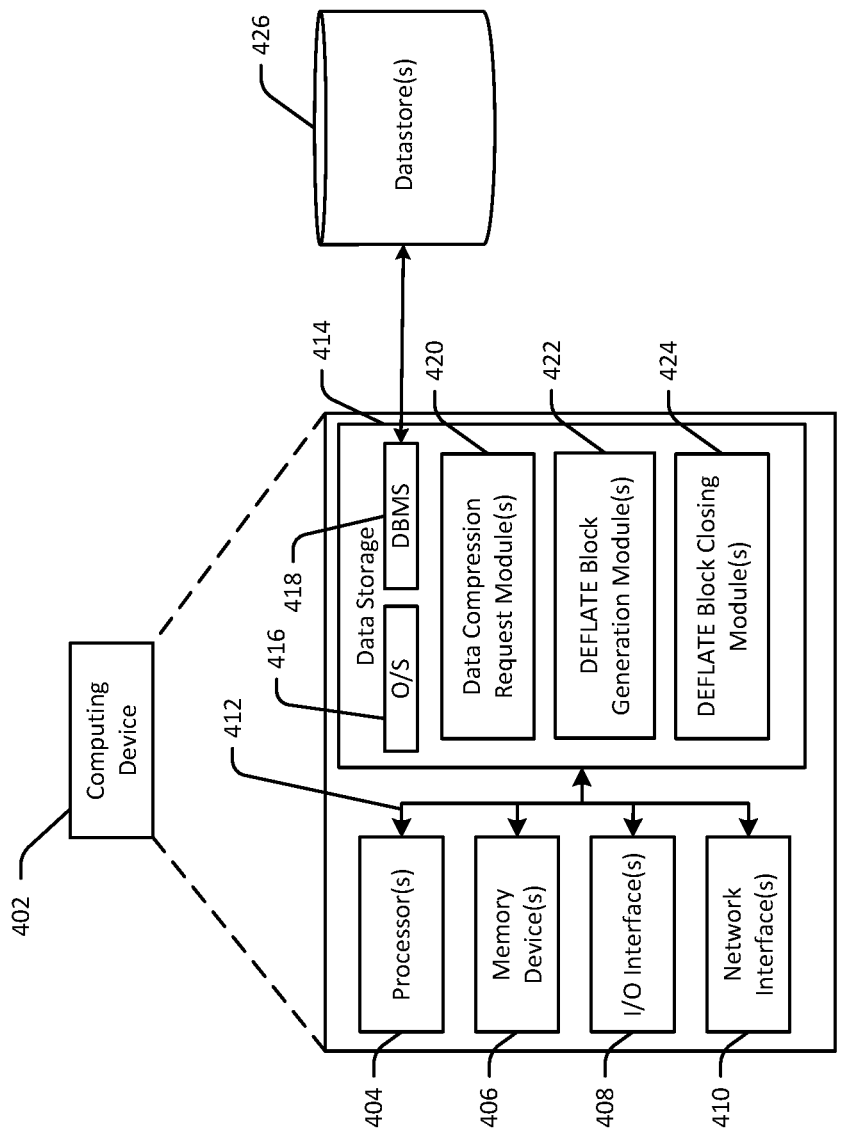
FIG. 4 is a schematic diagram of an illustrative computing device configured to implement one or more example embodiments.

FIG. 4 is a schematic diagram of an illustrative computing device 402 configured to implement one or more example embodiments of the disclosure. The computing device 402 may be any suitable device including, without limitation, a server, a personal computer (PC), a tablet, a smartphone, a wearable device, a voice-enabled device, or the like. While any particular component of the computing device 402 may be described herein in the singular, it should be appreciated that multiple instances of any such component may be provided, and functionality described in connection with a particular component may be distributed across multiple ones of such a component.

Although not depicted in FIG. 4, the computing device 402 may be configured to communicate with one or more other devices, systems, datastores, or the like via one or more networks. Such network(s) may include, but are not limited to, any one or more different types of communications networks such as, for example, cable networks, public networks (e.g., the Internet), private networks (e.g., frame-relay networks), wireless networks, cellular networks, telephone networks (e.g., a public switched telephone network), or any other suitable private or public packet-switched or circuit-switched networks. Such network(s) may have any suitable communication range associated therewith and may include, for example, global networks (e.g., the Internet), metropolitan area networks (MANs), wide area networks (WANs), local area networks (LANs), or personal area networks (PANs). In addition, such network(s) may include communication links and associated networking devices (e.g., link-layer switches, routers, etc.) for transmitting network traffic over any suitable type of medium including, but not limited to, coaxial cable, twisted-pair wire (e.g., twisted-pair copper wire), optical fiber, a hybrid fiber-coaxial (HFC) medium, a microwave medium, a radio frequency communication medium, a satellite communication medium, or any combination thereof.

In an illustrative configuration, the computing device 402 may include one or more processors (processor(s)) 404, one or more memory devices 406 (generically referred to herein as memory 406), one or more input/output ("I/O") interface(s) 408, one or more network interfaces 410, and data storage 414. The computing device 402 may further include one or more buses 412 that functionally couple various components of the computing device 402.

The bus(es) 412 may include at least one of a system bus, a memory bus, an address bus, or a message bus, and may permit the exchange of information (e.g., data (including computer-executable code), signaling, etc.) between various components of the computing device 402. The bus(es) 412 may include, without limitation, a memory bus or a memory controller, a peripheral bus, an accelerated graphics port, and so forth. The bus(es) 412 may be associated with any suitable bus architecture including, without limitation, an Industry Standard Architecture (ISA), a Micro Channel Architecture (MCA), an Enhanced ISA (EISA), a Video Electronics Standards Association (VESA) architecture, an Accelerated Graphics Port (AGP) architecture, a Peripheral Component Interconnects (PCI) architecture, a PCI-Express architecture, a Personal Computer Memory Card International Association (PCMCIA) architecture, a Universal Serial Bus (USB) architecture, and so forth.

The memory 406 may include volatile memory (memory that maintains its state when supplied with power) such as random access memory (RAM) and/or non-volatile memory (memory that maintains its state even when not supplied with power) such as read-only memory (ROM), flash memory, ferroelectric RAM (FRAM), and so forth. Persistent data storage, as that term is used herein, may include non-volatile memory. In certain example embodiments, volatile memory may enable faster read/write access than non-volatile memory. However, in certain other example embodiments, certain types of non-volatile memory (e.g., FRAM) may enable faster read/write access than certain types of volatile memory.

In various implementations, the memory 406 may include multiple different types of memory such as various types of static random access memory (SRAM), various types of dynamic random access memory (DRAM), various types of unalterable ROM, and/or writeable variants of ROM such as electrically erasable programmable read-only memory (EE-PROM), flash memory, and so forth. The memory 406 may include main memory as well as various forms of cache memory such as instruction cache(s), data cache(s), translation lookaside buffer(s) (TLBs), and so forth. Further, cache memory such as a data cache may be a multi-level cache organized as a hierarchy of one or more cache levels (L1, L2, etc.).

The data storage 414 may include removable storage and/or non-removable storage including, but not limited to, magnetic storage, optical disk storage, and/or tape storage. The data storage 414 may provide non-volatile storage of computer-executable instructions and other data. The memory 406 and the data storage 414, removable and/or non-removable, are examples of computer-readable storage media (CRSM) as that term is used herein.

The data storage 414 may store computer-executable code, instructions, or the like that may be loadable into the memory 406 and executable by the processor(s) 404 to cause the processor(s) 404 to perform or initiate various operations. The data storage 414 may additionally store data that may be copied to memory 406 for use by the processor(s) 404 during the execution of the computer-executable instructions. Moreover, output data generated as a result of execution of the computer-executable instructions by the processor(s) 404 may be stored initially in memory 406 and may ultimately be copied to data storage 414 for non-volatile storage.

More specifically, the data storage 414 may store one or more operating systems (O/S) 416; one or more database management systems (DBMS) 418 configured to access the memory 406 and/or one or more external datastores 426; and one or more program modules, applications, engines, managers, computer-executable code, scripts, or the like such as, for example, data compression request module(s) 420, DEFLATE block generation module(s) 422, and DEFLATE block closing module(s) 424. Any of the components depicted as being stored in data storage 414 may include any combination of software, firmware, and/or hardware. The software and/or firmware may include computer-executable instructions (e.g., computer-executable program code) that may be loaded into the memory 406 for execution by one or more of the processor(s) 404 to perform any of the operations described earlier in connection with correspondingly named modules.

Although not depicted in FIG. 4, the data storage 414 may further store various types of data utilized by components of the computing device 402 (e.g., data stored in the datastore(s) 426). Any data stored in the data storage 414 may be loaded into the memory 406 for use by the processor(s) 404 in executing computer-executable instructions. In addition, any data stored in the data storage 414 may potentially be stored in the external datastore(s) 426 and may be accessed via the DBMS 418 and loaded in the memory 406 for use by the processor(s) 404 in executing computer-executable instructions.

The processor(s) 404 may be configured to access the memory 406 and execute computer-executable instructions loaded therein. For example, the processor(s) 404 may be configured to execute computer-executable instructions of the various program modules, applications, engines, managers, or the like of the computing device 402 to cause or facilitate various operations to be performed in accordance with one or more embodiments of the disclosure. The processor(s) 404 may include any suitable processing unit capable of accepting data as input, processing the input data in accordance with stored computer-executable instructions, and generating output data. The processor(s) 404 may include any type of suitable processing unit including, but not limited to, a central processing unit, a microprocessor, a Reduced Instruction Set Computer (RISC) microprocessor, a Complex Instruction Set Computer (CISC) microprocessor, a microcontroller, an Application Specific Integrated Circuit (ASIC), a Field-Programmable Gate Array (FPGA), a System-on-a-Chip (SoC), a digital signal processor (DSP), and so forth. Further, the processor(s) 404 may have any suitable microarchitecture design that includes any number of constituent components such as, for example, registers, multiplexers, arithmetic logic units, cache controllers for controlling read/write operations to cache memory, branch predictors, or the like. The microarchitecture design of the processor(s) 404 may be capable of supporting any of a variety of instruction sets.

Referring now to other illustrative components depicted as being stored in the data storage 414, the O/S 416 may be loaded from the data storage 414 into the memory 406 and may provide an interface between other application software executing on the computing device 402 and hardware resources of the computing device 402. More specifically, the O/S 416 may include a set of computer-executable instructions for managing hardware resources of the computing device 402 and for providing common services to other application programs. In certain example embodiments, the O/S 416 may include or otherwise control execution of one or more of the program modules, engines, managers, or the like depicted as being stored in the data storage 414. The O/S 416 may include any operating system now known or which may be developed in the future including, but not limited to, any server operating system, any mainframe operating system, or any other proprietary or non-proprietary operating system.

The DBMS 418 may be loaded into the memory 406 and may support functionality for accessing, retrieving, storing, and/or manipulating data stored in the memory 406, data stored in the data storage 414, and/or data stored in external datastore(s) 454. The DBMS 418 may use any of a variety of database models (e.g., relational model, object model, etc.) and may support any of a variety of query languages. The DBMS 418 may access data represented in one or more data schemas and stored in any suitable data repository. Data stored in the datastore(s) 454 may include, for example, media data 456. For instance, the datastore(s) 454 may include the media database 138 and the media data 456 may include the media data streams 140. External datastore(s) 454 that may be accessible by the computing device 402 via the DBMS 418 may include, but are not limited to, databases (e.g., relational, object-oriented, etc.), file systems, flat files, distributed datastores in which data is stored on more than one node of a computer network, peer-to-peer network datastores, or the like.

Referring now to other illustrative components of the computing device 402, the input/output (I/O) interface(s) 408 may facilitate the receipt of input information by the computing device 402 from one or more I/O devices as well as the output of information from the computing device 402 to the one or more I/O devices. The I/O devices may include any of a variety of components such as a display or display screen having a touch surface or touchscreen; an audio output device for producing sound, such as a speaker; an audio capture device, such as a microphone; an image and/or video capture device, such as a camera; a haptic unit; and so forth. Any of these components may be integrated into the computing device 402 or may be separate. The I/O devices may further include, for example, any number of peripheral devices such as data storage devices, printing devices, and so forth.

The I/O interface(s) 408 may also include an interface for an external peripheral device connection such as universal serial bus (USB), FireWire, Thunderbolt, Ethernet port or other connection protocol that may connect to one or more networks. The I/O interface(s) 408 may also include a connection to one or more antennas to connect to one or more networks via a wireless local area network (WLAN) (such as Wi-Fi) radio, Bluetooth, and/or a wireless network radio, such as a radio capable of communication with a wireless communication network such as a Long Term Evolution (LTE) network, WiMAX network, 3G network, etc.

The computing device 402 may further include one or more network interfaces 410 via which the computing device 402 may communicate with any of a variety of other systems, platforms, networks, devices, and so forth. The network interface(s) 410 may enable communication, for example, with one or more other devices via one or more of the network(s) 406.

It should be appreciated that the program modules/engines depicted in FIG. 4 as being stored in the data storage 414 are merely illustrative and not exhaustive and that processing described as being supported by any particular module may alternatively be distributed across multiple modules, engines, or the like, or performed by a different module, engine, or the like. In addition, various program module(s), script(s), plug-in(s), Application Programming Interface(s) (API(s)), or any other suitable computer-executable code hosted locally on the computing device 402 and/or other computing devices accessible via one or more networks, may be provided to support functionality provided by the modules depicted in FIG. 4 and/or additional or alternate functionality. Further, functionality may be modularized in any suitable manner such that processing described as being performed by a particular module may be performed by a collection of any number of program modules, or functionality described as being supported by any particular module may be supported, at least in part, by another module. In addition, program modules that support the functionality described herein may be executable across any number of cluster members in accordance with any suitable computing model such as, for example, a client-server model, a peer-to-peer model, and so forth. In addition, any of the functionality described as being supported by any of the modules depicted in FIG. 4 may be implemented, at least partially, in hardware and/or firmware across any number of devices.

It should further be appreciated that the computing device 402 may include alternate and/or additional hardware, software, or firmware components beyond those described or depicted without departing from the scope of the disclosure. More particularly, it should be appreciated that software, firmware, or hardware components depicted as forming part of the computing device 402 are merely illustrative and that some components may not be present or additional components may be provided in various embodiments. While various illustrative modules have been depicted and described as software modules stored in data storage 414, it should be appreciated that functionality described as being supported by the modules may be enabled by any combination of hardware, software, and/or firmware. It should further be appreciated that each of the above-mentioned modules may, in various embodiments, represent a logical partitioning of supported functionality. This logical partitioning is depicted for ease of explanation of the functionality and may not be representative of the structure of software, hardware, and/or firmware for implementing the functionality. Accordingly, it should be appreciated that functionality described as being provided by a particular module may, in various embodiments, be provided at least in part by one or more other modules. Further, one or more depicted modules may not be present in certain embodiments, while in other embodiments, additional program modules and/or engines not depicted may be present and may support at least a portion of the described functionality and/or additional functionality.

One or more operations of the method 300 may be performed by a computing device 402 having the illustrative configuration depicted in FIG. 4, or more specifically, by one or more program modules, engines, applications, or the like executable on such a device. It should be appreciated, however, that such operations may be implemented in connection with numerous other device configurations.

The operations described and depicted in the illustrative method of FIG. 3 may be carried out or performed in any suitable order as desired in various example embodiments of the disclosure. Additionally, in certain example embodiments, at least a portion of the operations may be carried out in parallel. Furthermore, in certain example embodiments, less, more, or different operations than those depicted in FIG. 3 may be performed.

Although specific embodiments of the disclosure have been described, one of ordinary skill in the art will recognize that numerous other modifications and alternative embodiments are within the scope of the disclosure. For example, any of the functionality and/or processing capabilities described with respect to a particular system, system component, device, or device component may be performed by any other system, device, or component. Further, while various illustrative implementations and architectures have been described in accordance with embodiments of the disclosure, one of ordinary skill in the art will appreciate that numerous other modifications to the illustrative implementations and architectures described herein are also within the scope of this disclosure. In addition, it should be appreciated that any operation, element, component, data, or the like described herein as being based on another operation, element, component, data, or the like may be additionally based on one or more other operations, elements, components, data, or the like. Accordingly, the phrase "based on," or variants thereof, should be interpreted as "based at least in part on."

The present disclosure may be a system, a method, and/or a computer program product. The computer program product may include a computer readable storage medium (or media) having computer readable program instructions thereon for causing a processor to carry out aspects of the present disclosure.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present disclosure.

Aspects of the present disclosure are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present disclosure. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

What is claimed is:

1. A computer-implemented method for compressing data, the method comprising:
sending input data to hardware configured to perform data compression;
storing, by the hardware, a data encoding generated based at least in part on the input data and end-of-block symbol data in data storage;
sending the data and the data encoding to the hardware for compression of the data;
receiving, from the hardware, compressed data generated by the hardware from the data using the data encoding;
inserting the compressed data into a current compressed data block;
determining that the current compressed data block is to be closed;
retrieving the end-of-block symbol data from the data storage; and
closing the current compressed data block based at least in part on the end-of-block symbol data.

2. The computer-implemented method of claim 1, wherein closing the current compressed data block comprises closing the current compressed data block without making a call to the hardware.

3. The computer-implemented method of claim 1, further comprising making a call to the hardware to generate a new data encoding.

4. The computer-implemented method of claim 1, wherein the end-of-block symbol data comprises an end-of-block symbol encoded value and a bit length of the end-of-block symbol encoded value, and wherein closing the current compressed data block comprises inserting the end-of-block symbol encoded value in the current compressed data block.

5. The computer-implemented method of claim 4, further comprising:
determining a byte in the current compressed data block at which to begin insertion of the end-of-block symbol encoded value; and
receiving, from the hardware, an indication of a bit offset, wherein inserting the end-of-block symbol encoded value into the current compressed data block comprises inserting the end-of-block symbol encoded value beginning at a bit in the determined byte corresponding to the bit offset.

6. The computer-implemented method of claim 1, wherein determining that the current compressed data block is to be closed comprises determining that a flush operation is to be performed to insert control data into a compressed data stream containing the current compressed data block, wherein the control data enables a decompressor to identify a specific location in the compressed data stream.

7. The computer-implemented method of claim 1, wherein the data encoding is a Huffman encoding and the current compressed data block is a DEFLATE block, wherein the Huffman encoding is a dynamic encoding, wherein the Huffman encoding is represented as a Huffman tree in a header of the DEFLATE block based at least in part on the Huffman encoding being the dynamic encoding, and wherein the header further comprises an encoding type bit set to indicate that the Huffman encoding is the dynamic encoding.

8. A system for compressing data, the system comprising:
at least one memory storing computer-executable instructions; and
at least one processor configured to access the at least one memory and execute the computer-executable instructions to:
send input data to hardware configured to perform data compression;
store, by the hardware, a data encoding generated based at least in part on the input data and end-of-block symbol data in data storage;
send the data and the data encoding to the hardware for compression of the data;
receive, from the hardware, compressed data generated by the hardware from the data using the data encoding;
insert the compressed data into a current compressed data block;
determine that the current compressed data block is to be closed;
retrieve the end-of-block symbol data from the data storage; and
close the current compressed data block based at least in part on the end-of-block symbol data.

9. The system of claim 8, wherein the at least one processor is configured to close the current compressed data block by executing the computer-executable instructions to close the current compressed data block without making a call to the hardware.

10. The system of claim 8, wherein the at least one processor is further configured to execute the computer-executable instructions to make a call to the hardware to generate a new data encoding.

11. The system of claim 8 wherein the end-of-block symbol data comprises an end-of-block symbol encoded value and a bit length of the end-of-block symbol encoded value, and wherein the at least one processor is configured to close the current compressed data block by executing the computer-executable instructions to insert the end-of-block symbol encoded value in the current compressed data block.

12. The system of claim 11, wherein the at least one processor is further configured to execute the computer-executable instructions to:
determine a byte in the current compressed data block at which to begin insertion of the end-of-block symbol encoded value; and
receive, from the hardware, an indication of a bit offset, wherein the at least one processor is configured to insert the end-of-block symbol encoded value into the current compressed data block by executing the computer-executable instructions to insert the end-of-block symbol encoded value beginning at a bit in the determined byte corresponding to the bit offset.

13. The system of claim 8, wherein the at least one processor is configured to determine that the current compressed data block is to be closed by executing the computer-executable instructions to determine that a flush operation is to be performed to insert control data into a compressed data stream containing the current compressed data block, wherein the control data enables a decompressor to identify a specific location in the compressed data stream.

14. The system of claim 8, wherein the data encoding is a Huffman encoding and the current compressed data block is a DEFLATE block, wherein the Huffman encoding is a dynamic encoding, wherein the Huffman encoding is represented as a Huffman tree in a header of the DEFLATE block based at least in part on the Huffman encoding being the dynamic encoding, and wherein the header further comprises an encoding type bit set to indicate that the Huffman encoding is the dynamic encoding.

15. A computer program product for compressing data, the computer program product comprising a computer readable storage medium having program instructions embodied therewith, the program instructions executable by a processing circuit to cause the processing circuit to perform a method comprising:
- sending input data to hardware configured to perform data compression;
- storing, by the hardware, a data encoding generated based at least in part on the input data and end-of-block symbol data in data storage;
- sending the data and the data encoding to the hardware for compression of the data;
- receiving, from the hardware, compressed data generated by the hardware from the data using the data encoding;
- inserting the compressed data into a current compressed data block;
- determining that the current compressed data block is to be closed;
- retrieving the end-of-block symbol data from the data storage; and
- closing the current compressed data block based at least in part on the end-of-block symbol data.

16. The computer program product of claim 15, wherein closing the current compressed data block comprises closing the current compressed data block without making a call to the hardware.

17. The computer program product of claim 15, the method further comprising making a call to the hardware to generate a new data encoding.

18. The computer program product of claim 15, wherein the end-of-block symbol data comprises an end-of-block symbol encoded value and a bit length of the end-of-block symbol encoded value, and wherein closing the current compressed data block comprises inserting the end-of-block symbol encoded value in the current compressed data block.

19. The computer program product of claim 18, the method further comprising:
- determining a byte in the current compressed data block at which to begin insertion of the end-of-block symbol encoded value; and
- receiving, from the hardware, an indication of a bit offset,
- wherein inserting the end-of-block symbol encoded value into the current compressed data block comprises inserting the end-of-block symbol encoded value beginning at a bit in the determined byte corresponding to the bit offset.

20. The computer program product of claim 15, wherein determining that the current compressed data block is to be closed comprises determining that a flush operation is to be performed to insert control data into a compressed data stream containing the current compressed data block, wherein the control data enables a decompressor to identify a specific location in the compressed data stream.

* * * * *